(12) United States Patent
He (10) Patent No.: US 9,362,402 B2
(45) Date of Patent: Jun. 7, 2016

(54) SEMICONDUCTOR DEVICES AND FABRICATION METHOD THEREOF

(71) Applicant: Semiconductor Manufacturing International (Shanghai) Corporation, Shanghai (CN)

(72) Inventor: Yonggen He, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/287,500

(22) Filed: May 27, 2014

(65) Prior Publication Data

US 2015/0123147 A1    May 7, 2015

(30) Foreign Application Priority Data

Nov. 5, 2013 (CN) .......................... 2013 1 0542823

(51) Int. Cl.
| | |
|---|---|
| *H01L 21/337* | (2006.01) |
| *H01L 21/336* | (2006.01) |
| *H01L 21/8234* | (2006.01) |
| *H01L 21/8238* | (2006.01) |
| *H01L 29/78* | (2006.01) |
| *H01L 29/66* | (2006.01) |
| *H01L 27/092* | (2006.01) |

(52) U.S. Cl.
CPC .... *H01L 29/7848* (2013.01); *H01L 21/823807* (2013.01); *H01L 21/823814* (2013.01); *H01L 21/823864* (2013.01); *H01L 27/092* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 2012/0202326 A1* | 8/2012 | Kronholz | H01L 21/31111 438/231 |
| 2013/0119444 A1* | 5/2013 | Cheng | H01L 21/30604 257/288 |
| 2013/0178024 A1* | 7/2013 | Flachowsky | H01L 21/823807 438/199 |

* cited by examiner

*Primary Examiner* — Su C Kim
*Assistant Examiner* — Junaiden Mirsalahuddin
(74) *Attorney, Agent, or Firm* — Anova Law Group, PLLC (57) ABSTRACT

A method is provided for fabricating a semiconductor device. The method includes providing a semiconductor substrate; and forming a first gate structure on the semiconductor substrate. The method also includes forming offset spacers doped with a certain type of ions to increase an anti-corrosion ability of the offset spacers on both sides of the first gate structure by a stability doping process; and forming trenches in the semiconductor substrate at both sides of the first gate structures. Further, the method includes forming stress layers in the trenches.

14 Claims, 7 Drawing Sheets

| Providing a semiconductor substrate having a first region and a second region; forming a first gate structure on the semiconductor substrate in the first region and a second gate structure on the semiconductor substrate in the second region | S1 |

| Forming sidewall spacers covering side surfaces of the first gate structure and the second gate structure on the semiconductor substrate | S2 |

| Forming a mask layer to cover the first gate structure, the second gate structure, the sidewall spacers and the semiconductor substrate | S3 |

| Forming a patterned photoresist layer cover the mask layer in the first region on the mask mask layer | S4 |

| Removing the mask layer in the second region by an etching process using the patterned photoresist layer as an etching mask | S5 |

| Forming trenches in the semiconductor substrate at both sides of the second gate structure by etching the semiconductor substrate | S6 |

| Forming stress layers in the trenches | S7 |

SEMICONDUCTOR DEVICES AND FABRICATION METHOD THEREOF

CROSS-REFERENCES TO RELATED APPLICATIONS

This application claims the priority of Chinese patent application No. 201310542823.2, filed on Nov. 5, 2013, the entirety of which is incorporated herein by reference.

FIELD OF THE INVENTION

The present invention generally relates to the field of semiconductor manufacturing technology and, more particularly, relates to semiconductor devices and fabrication techniques thereof.

BACKGROUND

With the rapid development of the semiconductor technology, carrier mobility enhancement technologies have attracted extensive research and applications. The drive current of a semiconductor device may be increased by increasing the carrier mobility of the channel region of the semiconductor device; and the performance of the semiconductor device may be improved.

In the fabrication of semiconductor devices, a stress may change the band gap and the carrier mobility of silicon, thus it has become more and more common to improve the performance of semiconductor devices by using the stress. Specifically, by properly controlling the stress applied onto the semiconductor devices, the carrier mobility of the channel regions of the semiconductor devices may be increased. Thus, the drive current of the semiconductor devices may be increased; and the performance of the semiconductor devices may be significantly improved. The carriers in the NMOS devices are electrons; and carriers in the PMOS devices are holes.

Currently, the embedded SiGe technology is often used to apply a compressive stress to the channel region of a PMOS device to improve the performance of the PMOS device. Specifically, a SiGe material is formed in the regions for forming the source/drain regions; and followed by doping the SiGe material to form the source/drain regions. The lattice mismatch between the silicon substrate and the SiGe material can generate a compressive stress to the channel region; the performance of the PMOS device can be improved.

Similarly, the embedded SiC technology is often used to apply a tensile stress to the channel region of an NMOS device to improve the performance of the NMOS device. Specifically, a SiC material is formed in the regions for forming the source/drain regions; and followed by doping the SiC material to form the source/drain regions. The lattice mismatch between the silicon substrate and the SiC material can generate a tensile stress to the channel region; the performance of the NMOS device can be improved.

Theoretically, the embedded SiGe technology and the embedded SiC technology may increase the carrier mobility of the semiconductor devices. However, in practical applications, it has been found that the semiconductor device with such technology may still have some issues, such as unacceptable electrical properties, etc. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a semiconductor substrate; and forming at least a first gate structure on the semiconductor substrate. The method also includes forming offset spacers doped with a certain type of ions to increase an anti-corrosion ability of the offset spacers on both sides of the first gate structure by a stability doping process; and forming trenches in the semiconductor substrate at both sides of the gate structures. Further, the method includes forming stress layers in the trenches.

Another aspect of the present disclosure includes a semiconductor device. The semiconductor device includes a semiconductor substrate; and at least a first gate structure formed on the semiconductor substrate. The semiconductor device also includes offset spacers doped with a certain type of ions to increase an anti-corrosion ability of the offset spacers formed on both sides of the first gate structure by a stability doping process; and a plurality of isolation structures formed in the semiconductor substrate. Further, the semiconductor device includes first stress layers formed in the semiconductor substrate at both sides of the first gate structure.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
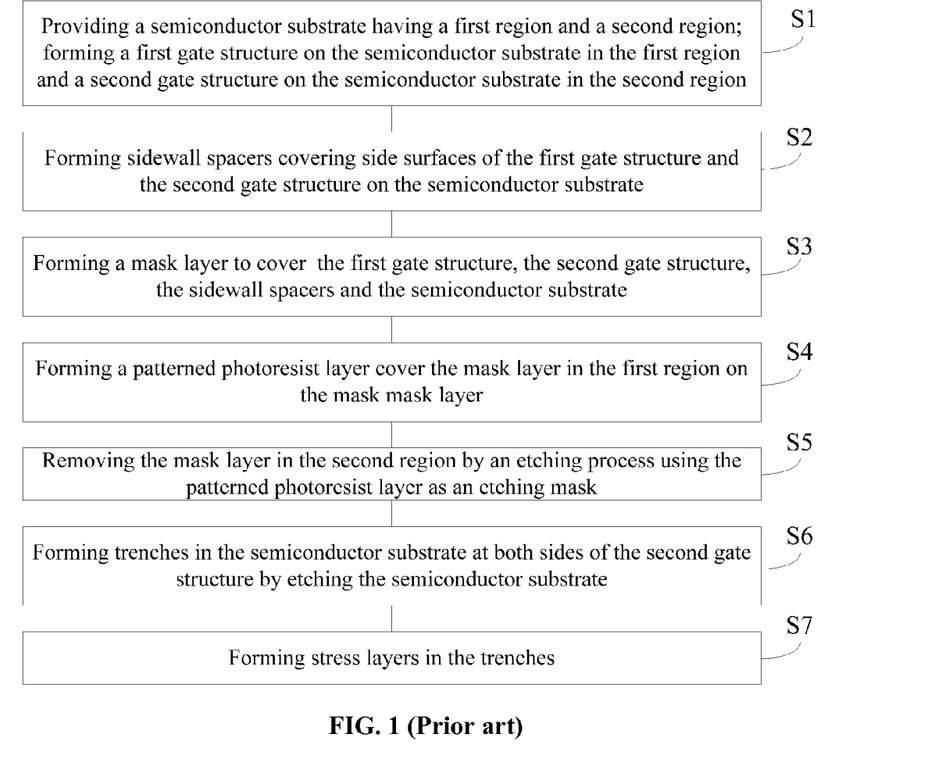
FIG. 1 illustrates an existing fabrication process of a semiconductor device.

FIG. 1 illustrates an existing fabrication process of a semiconductor device.

As shown in FIG. 1, the fabrication process includes, sequentially, providing a semiconductor substrate having a first region and a second region; and forming a first gate structure on the surface of the semiconductor substrate in the first region and a second gate structure on the surface of the semiconductor substrate in the second region (S1). The method also includes forming sidewall spacers on both sides of the first gate structure and the second gate structure (S2); and forming a mask layer to cover the surfaces of the first gate structure, the second gate structure, the sidewall spacers and the semiconductor substrate (S3). Further, the method includes forming a patterned photoresist layer on the mask layer to cover the surface of the hard mask layer in the first region (S4); and removing the hard mask layer in the second region using the patterned photoresist layer as an etching mask (S5). Further, the method also includes forming trenches in the semiconductor substrate at both sides of the second gate structure (S6); and filling the trenches to form stress layers (S7).

When the stress layers are formed in the trenches, defective layers may be formed on the side surfaces of the top region of the second gate structure. The defective layers may be the material of the stress layers formed on the side surfaces of the top region of the second gate structure. More severely, defectives layers may also be formed on the side surfaces of the gate electrode layer of the second gate structure. The defective layers may lower the stability of the semiconductor device; and may deteriorate the electrical properties of the semiconductor device.

The formation of the defective layers may include a plurality of reasons. Before forming the stress layers, the sidewall spacers on both sides of the second gate may have gone through a few etching processes, such as the etching process for removing the mask layer in the second region, and the etching process for forming the trenches in the semiconductor substrate, etc. All the etching processes may also etch the sidewall spacers. The etching processes may be dry etching processes. The etching direction of the dry etching processes may be vertical to the semiconductor substrate, thus the damages caused by the etching processes to the top region of the sidewall spacers, i.e., gate shoulders, may be the most severe; and it may be easy to remove the top portions of the sidewall spacers. Thus, the top region of the side surfaces (may be referred as gate shoulders) of the second gate structure may be exposed. More severely, if the etching time is relatively long, the sidewall spacers may be etched by a relatively long time, thus more area of the top region of the side surfaces of the second gate structure may be exposed.

If portions the side surfaces of the second gate structure are exposed, when the stress layers are subsequently formed by a selective epitaxial growth process and the stress layers may contain a relatively large amount of silicon. According to characteristics of the selective epitaxial growth process, defective layers may also be formed on the side surfaces of the gate electrode layer made of poly silicon or doped poly silicon when the stress layers is formed by the selective epitaxial growth process.

If the defective layers are formed on the side surfaces of the second gate structure, the electrical properties of the semiconductor device may be significantly affected; and the reliability of the semiconductor device may be reduced. According to the disclosed methods and device structures, the defective layers may be prevented by doping the offset sidewall spacers to increase their anti-corrosion ability; and to prevent exposing the side surfaces of the gate structures.

Figure 18:
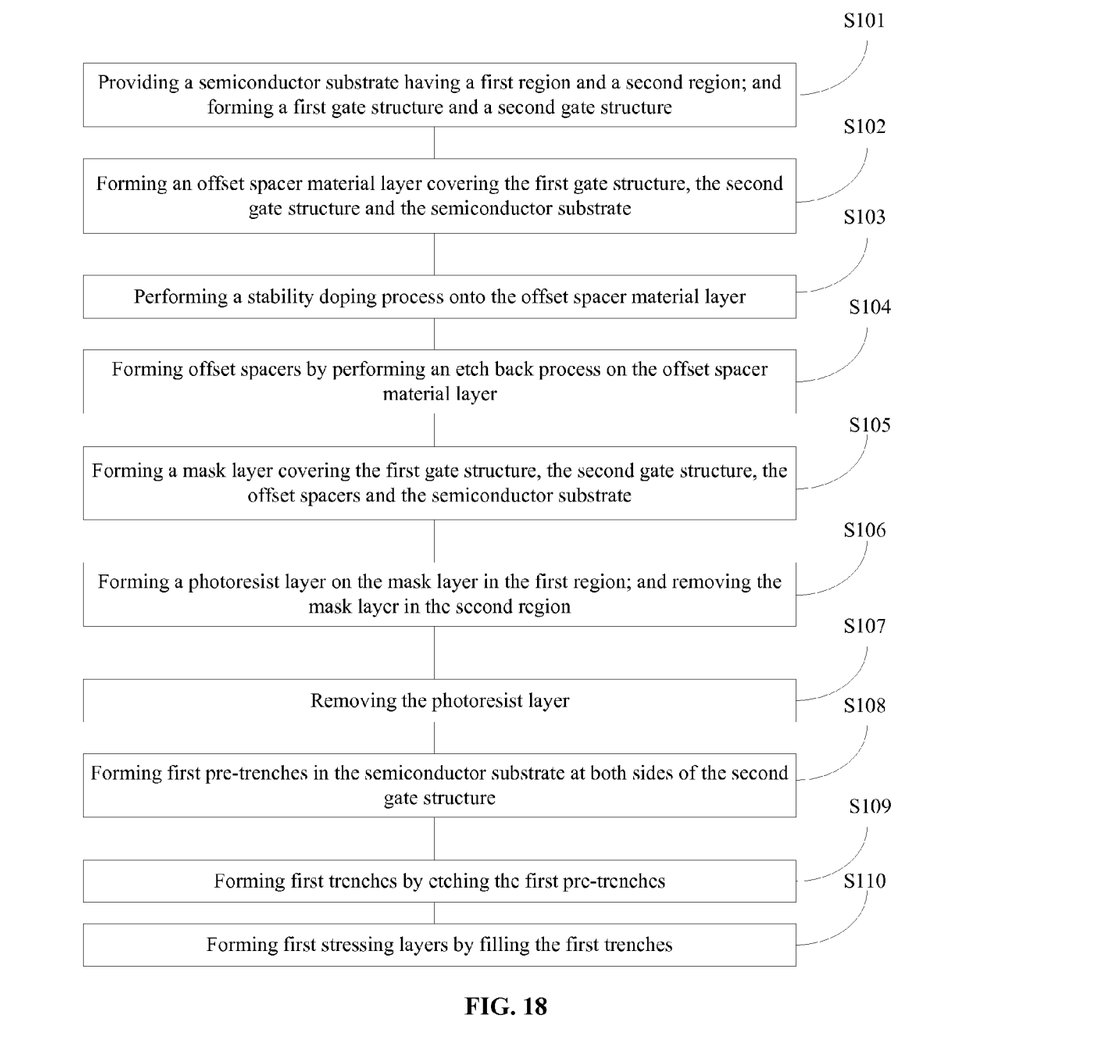
FIG. 18 illustrates an exemplary fabrication process of a semiconductor device consistent with the disclosed embodiments.

FIG. 18 illustrates an exemplary fabrication process of a semiconductor device consistent with disclosed embodiments; and FIGS. 2~11 illustrate semiconductor structures corresponding to certain stages of the exemplary fabrication process.

Figure 2:
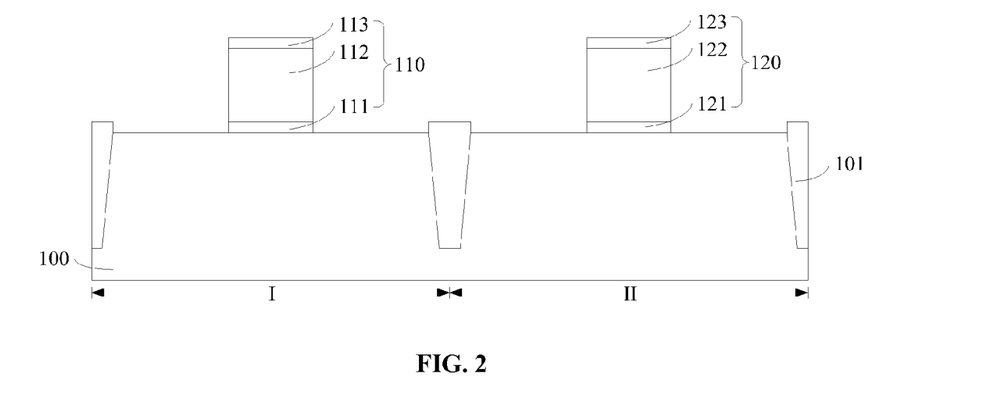
FIGS. 2~11 illustrate semiconductor structures corresponding to certain stages of an exemplary fabrication process of a semiconductor device consistent with the disclosed embodiments.

As shown in FIG. 2, at the beginning of the fabrication process, a semiconductor substrate with certain structures is provided (S101). FIG. 2 illustrates a corresponding semiconductor structure.

As shown in FIG. 2, a semiconductor substrate 100 is provided; and the semiconductor substrate 100 may have a first region I and a second region II. Further, a first gate structure 110 may be formed on the surface of the semiconductor substrate 100 in the first region I; and a second gate structure 120 may formed on the surface of the semiconductor substrate 100 in the second region II. Further, isolation structures 101 may be formed in the semiconductor substrate 100 between the first region I and the second region II.

The semiconductor substrate 100 may include any appropriate semiconductor materials, such as silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor, etc. In one embodiment, the semiconductor substrate 100 is made of silicon. The semiconductor substrate 100 provides a base for subsequent processes and structures.

Further, referring to FIG. 2, the first region I may be an NMOS region or a PMOS region. The second region II may be an NMOS region or a PMOS region. When first region I is an NMOS region, the second region II may be a PMOS region. When the first region I is a PMOS region, the second region II may be an NMOS region. The first region I and the second region II may be adjacent, or spaced. For illustrative purposes, in one embodiment, the first region I is an NMOS region, the second region II is a PMOS region; and the semiconductor device is a CMOS transistor. Other configurations may also be used.

Further, referring to FIG. 2, the first gate structure 110 may include a first gate oxide layer 111 formed on the surface of the semiconductor substrate 100 in the first region I, a first gate electrode layer 112 formed on the first gate oxide layer 111; and a first top hard mask layer 113 formed on the first gate electrode layer 112.

Further, referring to FIG. 2, the second gate structure 120 may include a second gate oxide layer 121 formed on the surface of the semiconductor substrate 100 in the second region II, a second gate electrode layer 122 formed on the second gate oxide layer 121; and a second top hard mask layer 123 formed on the second gate electrode layer 122.

The first gate oxide layer 111 and the second gate oxide layer 121 may be made of any appropriate material, such as silicon oxide, or appropriate high-dielectric (high-K) material, etc. The first gate electrode layer 112 and the second gate electrode layer 122 may be made of any appropriate material, such as poly silicon, doped poly silicon, or appropriate metal material, etc. In one embodiment, the first gate oxide layer 111 and the second gate oxide layer 121 are made of silicon oxide; and the first gate electrode layer 112 and the second gate electrode layer 122 are made of poly silicon or doped poly silicon.

Various processes may be used to form the first gate oxide layer 111 and the second gate oxide layer 121, such as a chemical vapor deposition (CVD) process, a physical vapor deposition (PVD) process, an atomic layer deposition (ALD) process, a flowable chemical vapor deposition (FCVD) process, a thermal oxidation process, or a sputtering process, etc.

Various processes may be used to form the first gate electrode layer 112 and the second gate electrode layer 122, such as a CVD process, a PVD process, an FCVD process, a sputtering process, or an electroplating process, etc.

The first top mask layer 113 and the second top mask layer 123 may be made of any appropriate material, such as silicon oxide, silicon nitride, silicon oxynitride, or silicon carbonitride, etc. In one embodiment, the first top mask layer 113 and the second top mask layer 123 are made of silicon nitride. The first top mask layer 113 and the second top mask layer 123 may be used as a mask for subsequently forming trenches in the semiconductor substrate 100; and protect the top of the first gate electrode layer 112 and the top of the second gate electrode layer 122 from being damaged by subsequent processes.

Various processes may be used to form the first top mask layer 113 and the second top mask layer 123, such as a CVD process, a PVD process, or a sputtering process, etc.

The isolation structures 101 may be made of any appropriate material, such as one of more of silicon oxide, silicon nitride, or silicon oxynitride, etc. The isolation structures 101 may be shallow trench isolation (STI) structures. Further, the isolation structures 101 may be used to prevent electrical connections between the first region I and the second region II.

Figure 3:
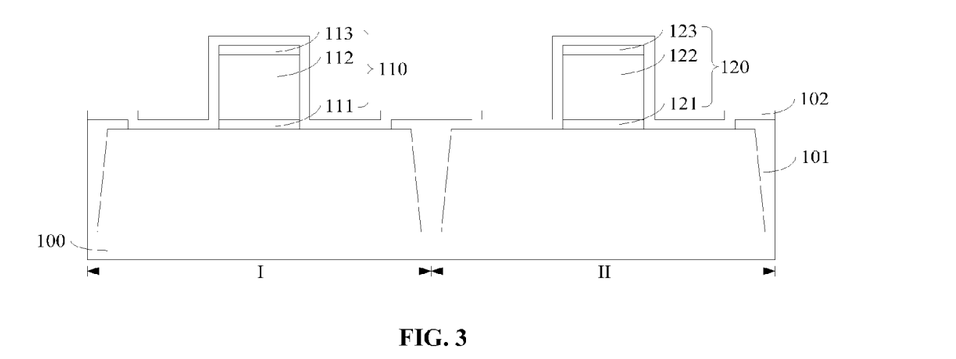

Returning to FIG. 18, after providing the semiconductor substrate 100 with the first electrode structure 110 and the second electrode structure 120, an offset spacer material layer may be formed (S102). FIG. 3 illustrates a corresponding semiconductor structure.

As shown in FIG. 3, an offset spacer material layer 102 is formed; and the offset spacer material layer 102 may cover the first gate structure 110, the second gate structure 120, and the semiconductor substrate 100. The offset spacer material layer 102 may be used to subsequently form offset spacers on the both sides of the first gate structure 110 and the second gate structure 120.

The offset spacer material layer 102 may be a single layer structure or a multiple-stacked structure. The offset spacer material layer 102 may be made of any appropriate material, such as silicon oxide, silicon nitride, silicon oxyntride, or silicon carbonitride, etc. In one embodiment, the offset spacer material layer 102 is a single layer structure made of silicon nitride. In certain other embodiments, the offset spacer material layer 102 is a double layer structure made of silicon oxide and silicon nitride. The silicon oxide layer may be formed firstly and the silicon nitride layer may be formed on the silicon oxide layer.

For illustrative purposes, a single layer offset spacer material layer 102 is used in the description. In one embodiment, the offset spacer material layer 102 is made of silicon nitride; and the thickness of the offset spacer material layer 102 may be in a range of approximately 50 Å~1000 Å.

Various processes may be used to form the offset spacer material layer 102, such as a CVD process, a PVD process, an ALD process, or an FCVD process, etc. In one embodiment, the offset spacer material layer 102 is formed by a thermal ALD process. The reaction gas of thermal ALD process may include a silicon source gas, a nitrogen source gas and nitrogen gas, etc. The silicon source gas may include $SiH_2Cl_2$, or $SiH_4$, etc. The nitrogen source gas may be $NH_3$, etc. The temperature of the reaction chamber of the thermal ALD process may be in a range of approximately 400° C.~600° C. The pressure of the reaction chamber may be in a range of approximately 0.1 Torr~0.5 Torr.

In one embodiment, before forming the offset spacer material layer 102, first lightly doped drain (LDD) regions (not shown) may be formed in the semiconductor substrate 100 at both sides of the first gate structure 110; and second lightly doped drain (LDD) regions (not shown) may be formed in the semiconductor substrate 100 at both sides of the second gate structure 120. The first LDD regions and the second LDD regions may be used to reduce the thermal carrier effect of the CMOS transistor. The first LDD regions and the second LDD regions may be formed by an ion implantation process, or a thermal diffusion process, etc.

Figure 4:
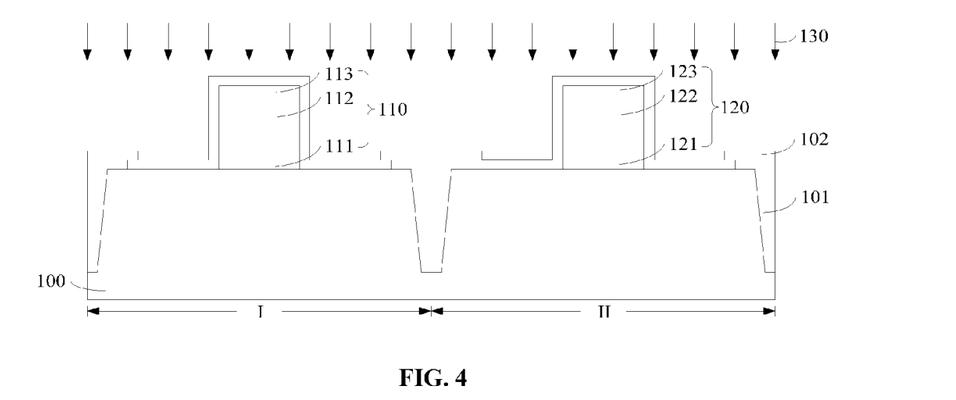

Returning to FIG. 18, after forming the offset spacer material layer 102, the offset spacer material layer 102 may be doped (S103). FIG. 4 illustrates a corresponding semiconductor structure.

As shown in FIG. 4, a stability doping process was performed onto the offset spacer material layer 102. For illustrative purposes, the stability doping process may be labeled as the stability doping process 130 in FIG. 4. The stability doping process 130 may be used to improve the anti-corrosion ability of the offset spacer material layer 102.

The offset spacer material layer 102 may be doped with any appropriate ions to improve the anti-corrosion ability. In one embodiment, carbon ions may be used to perform the stability doping process 130 to improve the anti-corrosion ability of the offset spacer material layer 102.

After the stability doping process 130, the offset spacer material layer 102 may be doped with carbon ions, the anti-corrosion ability of the offset spacer material layer 102 may be improved. The reason for the carbon ion to increase the anti-corrosion ability of the offset spacer material layer 102 may be rather complex. One possible mechanism may be provided as following.

Carbon atoms themselves may have a relatively high stability, after the offset spacer material layer 102 is doped with the carbon ions, the relatively high stability of the carbon ions may increase the stability of the offset spacer material layer 102. That is, the thermal stability and the chemical stability of the offset spacer material layer 102 may be improved. The improved stability may increase the anti-corrosion ability of the offset spacer material layer 102, thus the anti-corrosion ability of the subsequently formed sidewall spacers may also be improved; and the etching rate of the subsequently formed sidewall spacers by subsequently processes may be reduced. Therefore, the side surfaces of the first gate structure 110 and the second gate structure 120 may unlikely be exposed after a plurality of etching processes; and the performance of the semiconductor device may be improved.

The offset spacer material layer 102 may be doped with the carbon ions (the stability doping process) with any appropriate process, such as an ion implantation process or a plasma doping process, etc. In one embodiment, an ion implantation process is used to dope the offset spacer material layer 102 with carbon ions. The energy of the ion implantation process may be in a range of approximately 6 keV~10 keV. The dose of the ion implantation process may be in a range of 1E16 atom/cm$^2$~5E17 atom/cm$^2$. If the dose of the ion implantation process is substantially low, the depth of the implanted carbon ions in the offset spacer material layer 102 may not be deep enough; and the implanted carbon ions may be unable to reduce the etching rate by the subsequent etching process because the concentration of the carbon ions in the offset spacer material layer 102 may be substantially low. If the dose of the ion implantation process is significantly high, the carbon ions may be implanted into the first gate structure 110, the second gate structure 120 and/or the semiconductor substrate 100, the performance the semiconductor device may be affected; the production cost may be increased, and the production efficiency may be lowered.

The concentration of carbon atoms in the offset spacer material layer 102 may be in any appropriate range. In one embodiment, the concentration of carbon in the offset spacer material layer 102 may be in a range of approximately 0.5%~10%.

The carbon atoms may be uniformly distributed in the offset spacer material layer 102. The carbon atoms may also be distributed with a concentration gradient increasing from the inner to the outer of the offset spacer layer 102.

When the concentration of carbon atoms increases from the inner of the offset spacer material layer 102 to the outer of the offset spacer material layer 102, the concentration of carbon atoms may also increase from the inner of the subsequently formed offset spacers to the outer of the subsequently formed offset spacers. The regions having more carbon atoms may be have a greater anti-corrosion ability, thus the offset spacers having a carbon concentrate gradient may still match the requirements for increasing the anti-corrosion ability. Further, it may be easier to dope the offset spacer material layer 102 with the carbon concentration gradient.

In one embodiment, when the offset spacer material layer 102 is doped with the carbon atoms, portions of the surface of the semiconductor substrate 100 at both sides of the first gate structure 110 and the second gate structure 120 are covered with the offset spacer material layer 102, thus the carbon atoms may be prevented from being doped into the semiconductor substrate 100. If the carbon atoms are doped into the semiconductor substrate 100, the anti-corrosion ability of the semiconductor substrate 100 may be improved; and it may increase the technical difficulties for subsequently forming trenches in the semiconductor substrate 100 by etching processes.

In certain other embodiments, the ions for the stability doping process 130 may be other ions that are able to improve the thermal stability and the chemical stability of the offset spacer material layer 102.

In certain other embodiments, the offset spacer material layer 102 may be in situ doped. When the offset spacer material layer 102 is being formed, a carbon source gas may be included into the reaction gas; and the carbon atoms may be in situ doped into the offset spacer material layer 102.

Figure 5:
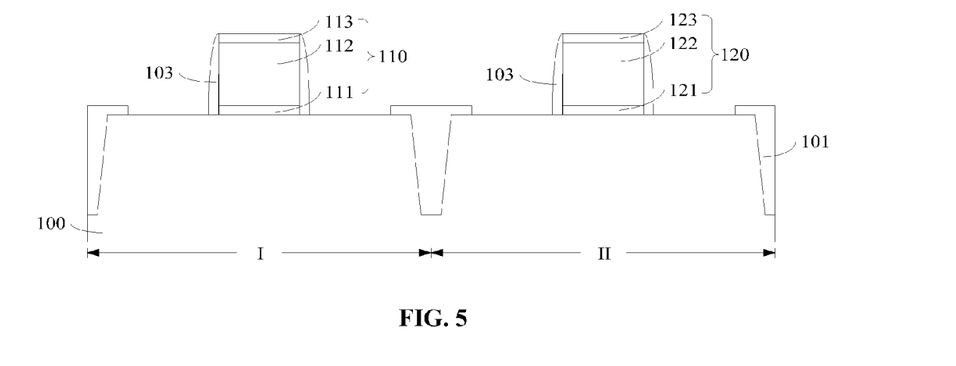

Returning to FIG. 18, after the stability doping process 130, offset spacers may be formed (S104). FIG. 5 illustrates a corresponding semiconductor structure.

As shown in FIG. 5, offset spacers 103 are formed on both sides of the first gate structure 110 and the second gate structure 120. The offset spacers 103 may be formed by performing an etch back process onto the offset spacer material layer 102. That is, portions of the offset spacer material layer 102 on the top surfaces of the first gate structure 110 and the second gate structure 120 and the portions of the surface semiconductor substrate 100 between the first gate structure 110 and the second gate structure 120 may be removed; and the offset spacers 102 may be formed on the side surfaces of the first gate structure 110 and the second gate structure 120.

Various processes may be used for the etch back process, such as a dry etching process, a wet etching process, or an ion beam etching process, etc. In one embodiment, an anisotropic dry etching process is used for the etch back process.

Specifically, the etching gas of the anisotropic dry etching process may include $CHF_3$, $O_2$, and Ar, etc. The flow of $CHF_3$ may be in a range of 10 sccm~100 sccm. The flow of $O_2$ may be in a range of approximately 30 sccm~50 sccm. The flow of Ar may be in a range of approximately 50 sccm~70 sccm. The pressure of the reaction chamber of the anisotropic dry etching process may be in a range of approximately 0.5 mTorr~5 mTorr. The source power of the anisotropic dry etching process may be in a range of approximately 200 W~1000 W; and the bias voltage may be in a range of approximately 200V~1000V.

Optionally and additionally, after forming the offset spacers 103, a thermal annealing process may be performed onto the offset spacers 103. The thermal annealing process may activate the carbon atoms in the offset spacers 103; and Si—C bonds may be formed in offset spacers 103. The bond energy of the Si—C bonds may be greater than the bond energy of Si—N bonds, thus the thermal stability and the chemical stability of the Si—C bonds may be better than the thermal stability and the chemical stability of the Si—N bonds. Therefore, the anti-corrosion ability of the offset spacers 103 may be further improved; and the etching rate of the sidewall spacers 103 by subsequent etching processes may be further reduced.

Figure 6:
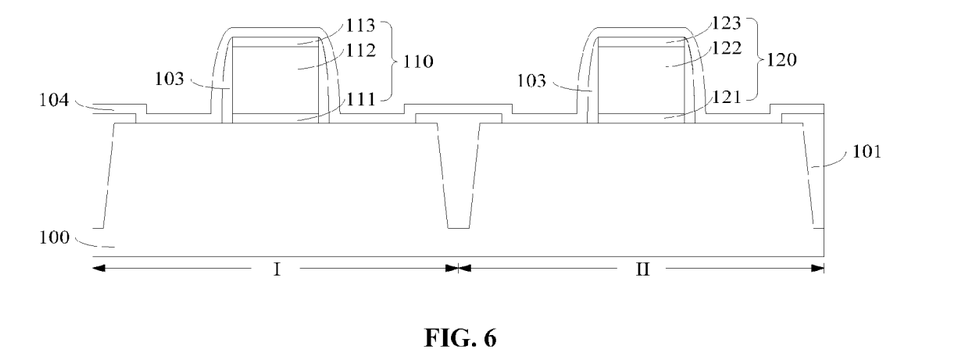

Returning to FIG. 18, after forming the offset spacers 103, a mask layer may be formed (S105). FIG. 6 illustrates a corresponding semiconductor structure.

As shown in FIG. 6, a mask layer 104 is formed; and the mask layer 104 may cover the isolation structures 101, the semiconductor substrate 100, the offset spacers 103, the first electrode structure 110 and the second electrode structure 120. The mask layer 104 may subsequently be used to protect the first gate structure 110 and the semiconductor substrate 110 in the first region I.

The mask layer 104 may be made of any appropriate material, such as silicon oxide, silicon nitride, or silicon oxynitride, etc. In one embodiment, the mask layer 104 is made of silicon nitride. Various processes may be used to form the mask layer 104, such as a CVD process, a PVD process, or an FCVD process, etc.

Figure 7:
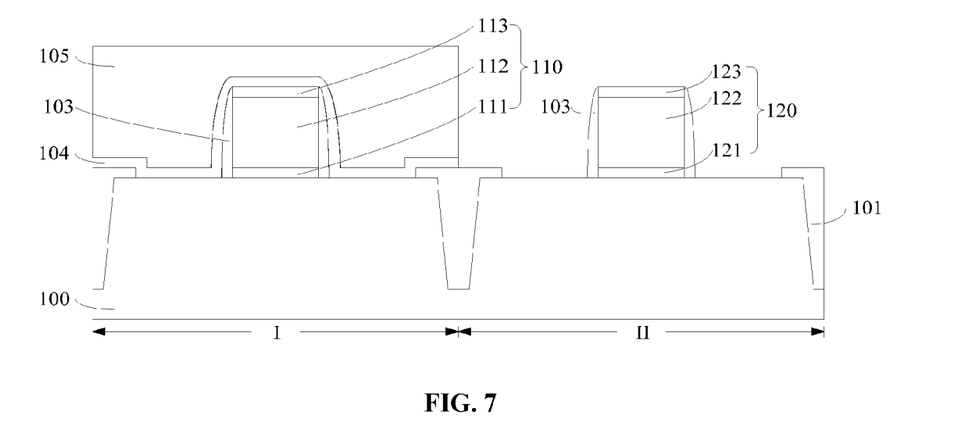

Returning to FIG. 18, after forming the mask layer 104, a photoresist layer may be formed on the surface of the mask layer 104 in the first region I; and the mask layer 104 in the second region II may be removed (S106). FIG. 7 illustrates a corresponding semiconductor structure.

As shown in FIG. 7, a photoresist layer 105 is formed on the surface of the mask layer 104 in the first region I; and the mask layer 104 on the surface of the semiconductor substrate 100 in the second region II are removed.

The photoresist layer 105 may be formed by forming an initial photoresist layer on the mask layer 104; and removing a portion of the initial photoresist layer on the surface of the mask layer 104 in the second region II by exposing and developing the initial photoresist layer. Thus, the photoresist layer 105 may only be formed on the surface of mask layer 104 in the first region I; and the surface of the mask layer 104 in the second region II may be exposed.

After forming the photoresist layer 105, the mask layer 104 in the second region II may be removed by an etching process using the photoresist layer 105 as an etching mask. The etching process may include a dry etching process, a wet etching process, or an ion beam etching process, etc. In one embodiment, a dry etching process is used to remove the mask layer 104 in the second region II.

The dry etching process may be a reactive ion etching (RIE) etching process. The reaction gas of the RIE process may include $CF_4$, $CHF_3$ and Ar, etc. The flow of $CF_4$ may be in a range of approximately 50 sccm~100 sccm. The flow of $CHF_3$ may be in a range of approximately 10 sccm~100 sccm. The flow of Ar may be in a range of approximately 100 sccm~300 sccm. The source power of the RIE process may be in a range of approximately 50 W~1000 W. The bias power of the RIE process may be in a range of approximately 50 W~250 W. The pressure of the RIE process may be in a range of approximately 50 mTorr~200 mTorr. The temperature of the chamber of the RIE process may be in range of approximately 20° C.~90° C.

In one embodiment, the anti-corrosion ability of the offset spacers 103 at both sides of the second gate structure 120 may be improved, thus the etching process, such as the RIE process, etc., for removing the mask layer 104 may having a substantially low etching rate to the offset spacers 103. Therefore, the width loss of the offset spacers 103 at both sides of the second gate structure 120 during the etching process may be reduced; and it may prevent the side surfaces of the second gate structure 120 from being exposed.

Figure 8:
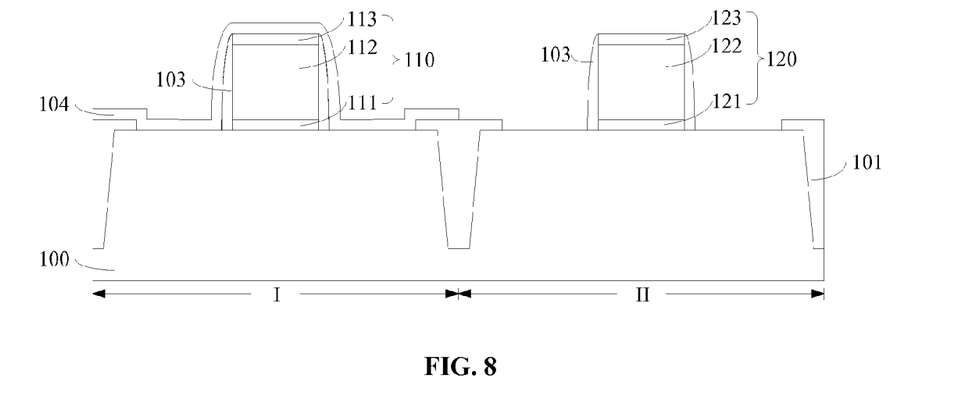

Returning to FIG. 18, after forming the photoresist layer 105 and removing the mask layer 104 is the second region II, the photoresist layer 105 may be removed (S107). FIG. 8 illustrates a corresponding semiconductor structure.

As shown in FIG. 8, the photoresist layer 105 is removed. The photoresist layer 105 may be removed by any appropriate process, such as a dry etching process, or a wet etching process, etc. In one embodiment, a dry etching process is used to remove the photoresist layer 105. The dry etching process maybe a plasma ashing process. The plasma ashing process may significantly reduce the damages to the offset spacers 103 during removing the photoresist layer 105.

The gas of the plasma ashing process may include oxygen, etc. The flow of oxygen may be in a range of approximately 10 sccm~1000 sccm. The reaction temperature of the plasma ashing process may be in a range of approximately 40° C.~250° C.

Figure 9:
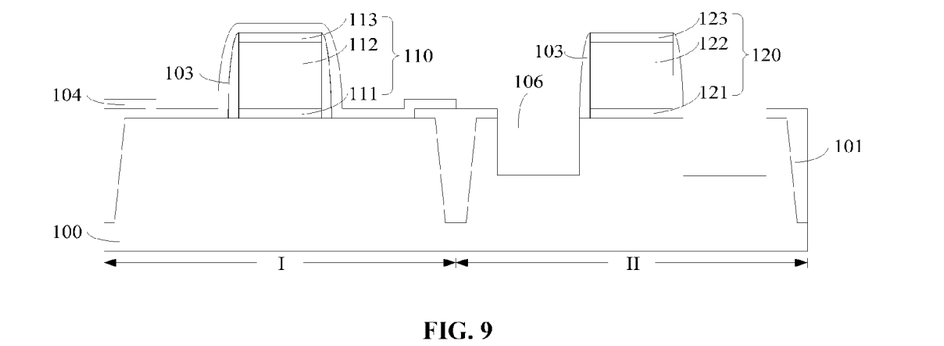

Returning to FIG. 18, after removing the photoresist layer 105, first pre-trenches may be formed (S108). FIG. 9 illustrates a corresponding semiconductor structure.

As shown in FIG. 9, first pre-trenches 106 are formed in the semiconductor substrate 100 at both sides of the second gate structure 120 in the second region II by an etching process using the offset spacers 103 at both sides of the second gate structure 120 as an etching mask. The pre-trenches 106 may be used to form first trenches by subsequent etching processes. The pre-trenches 106 may have any appropriate shape, such as rectangle, etc.

Various processes may be used to form the first pre-trenches 106, such as a dry etching process, a wet etching process, or an ion beam etching process, etc. In one embodiment, the first pre-trenches 106 are formed by a dry etching process. The dry etching process may be a plasma etching process. The etching gas may include $SF_6$, $CF_4$, $C_2F_6$, $CCl_4$, or $Cl_2$, etc.

In one embodiment, the offset spacer material layer 102 may be doped with carbon ions before forming the offset spacers 103, thus the anti-corrosion ability of the offset spacers 103 may be improved. When the first pre-trenches 106 is being formed by the plasma etching process, the plasma etching process may have substantially small damages to the offset spacers 103. Therefore, after forming the first pre-trenches 106, the side surfaces of the second gate structure 120 may be still covered with the offset spacers 103; and the side surfaces of the second gate electrode layer 122 may not be exposed.

When the first pre-trenches 106 is formed by the etching process, the semiconductor substrate 100 in the first region I and the first gate structure 110 may be protected by the mask layer 104 in the first region I, thus the semiconductor substrate 100 in the first region I and the first gate structure 110 may not be damaged by the etching process.

Figure 10:
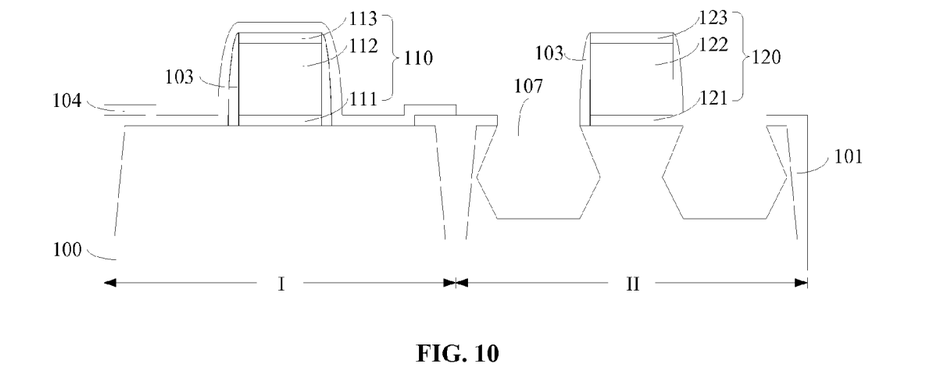

Returning to FIG. 18, after forming the first pre-trenches 106, first trenches may be formed (S109). FIG. 10 illustrates a corresponding semiconductor structure.

As shown in FIG. 10, sigma (Σ) shape first trenches 107 are formed in the semiconductor substrate 100 at both sides of the second gate structure 120. The sigma shape first trenches 107 may concave to the channel region of the semiconductor device. Such a shape and structure may shorten the channel length of the semiconductor device; and requirements for the device minimization may be matched. Further, the sigma shape first trenches 107 may have a largest undercut under the offset spacers 103 on the second gate structure 120; a stress material subsequently formed in the sigma shape first trenches 107 may generate a larger stress onto the channel region of the semiconductor device. Thus, the carrier mobility of the channel region may be increased; and the performance of the semiconductor device may be improved.

Various processes may be used to form the first trenches 107, such as a dry etching process, or a wet etching process, etc. In one embodiment, the first trenches 107 are formed by a wet etching process. The etching solution of the wet etching process may be an ammonia solution, or a tetramethylammonium hydroxide (TMAOH) solution, etc.

When the ammonia solution or the TMAOH solution is used as an etching solution of the wet etching process to form the first trenches 107, the etching rate of the (100) crystal face of the semiconductor substrate 100 may be greater than the etching rate of the (111) crystal face of the semiconductor substrate 100, thus after the wet etching process, the first trenches 107 with the sigma shape may be formed.

In one embodiment, the stability of the sidewall spacers 103 at both sides of the second gate structure 120 may be improved; and the anti-corrosion ability of the offset spacers 103 may be relatively strong, thus the wet etching process for forming the first trenches 107 may have a substantially small etching rate to the offset spacers 103; and may generate substantially small damages to the offset spacers 103. Therefore, after forming the first trenches 107, the side surfaces of the second gate structure 120 may still be covered with the offset spacers 102; and the side surfaces of the second gate structure 120 may not be exposed.

In certain other embodiments, the trenches 107 may have other appropriate shapes, such a rectangular shape, or a "U" shape, etc. Such shapes of trenches 107 may be directly formed by etching the semiconductor substrate 100 at both sides of the second gate structure 120. That is, the process for forming the pre-trenches 106 may be omitted.

Figure 11:
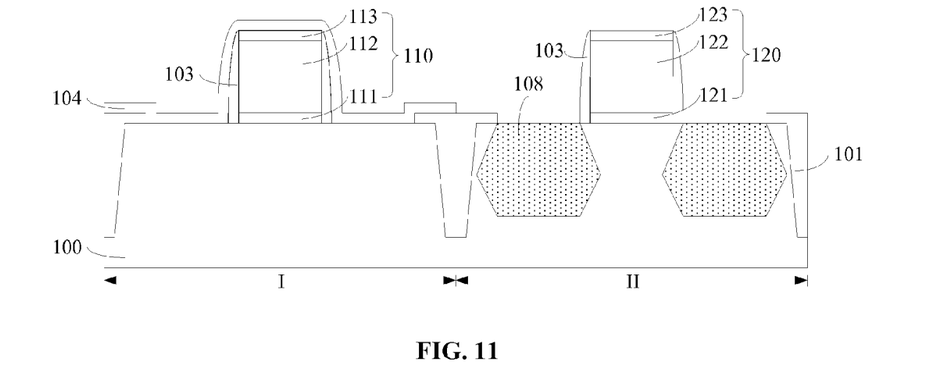

Returning to FIG. 18, after forming the first trenches 107, first stress layers may be formed (S110). FIG. 11 illustrates a corresponding semiconductor structure.

As shown in FIG. 11, a first stress layer 108 is formed in each of the first trenches 107. The top surface of the first stress layer 108 may level with the top surface of the semiconductor substrate 100. In certain other embodiments, the top surface of the first stress layer 108 may be higher than the top surface of the semiconductor substrate 100.

The first stress layers 108 may be made of any appropriate material, such as SiGe, SiGeB, SiC, or SiCP, etc. When the second region II is an NMOS region, the first stress layers 108 may be made of SiC or SiCP. The first stress layers 108 may generate a tensile stress to the channel region of the NMOS region, thus the carrier mobility of the NMOS region may be increased. When the second region II is a PMOS region, the first stress layers 108 may be made of SiGe or SiGeB. The first stress layers 108 may generate a compressive stress to the channel region of the PMOS region, thus the carrier mobility of the PMOS region may be increased. In one embodiment, for illustrative purposes, a PMOS region is described as the second region II.

Various processes may be used to form the first stress layers 108, such as a PVD process, a CVD process, an ALD process, an FCVD process, or a selective epitaxial growth process, etc. In one embodiment, a selective epitaxial growth process is used to form the first stress layers 108.

In one embodiment, the first stress layers 108 are made of SiGe, the reaction gas of the selective epitaxial growth process may include a silicon source gas, a germanium source gas, HCl, and $H_2$, etc. The silicon source gas may include $SiH_4$ or $SiH_2Cl_2$, etc. The germanium source gas may include $GeH_4$, etc. The flow of the silicon source gas may be in a range of approximately 1 sccm~1000 sccm. The flow of the germanium source gas may be in a range of approximately 1 sccm~1000 sccm. The flow of HCl may be in a range of approximately 1 sccm~1000 sccm. The flow of $H_2$ may be in a range of approximately 100 sccm~50000 sccm. The reaction chamber of the selective epitaxial growth process may be in a range of 1 Torr~500 Torr. The temperature of the reaction chamber may be in a range of approximately 400° C.~900° C.

In certain other embodiments, the first stress layers 108 may be made of SiGeB, thus the reaction gas of the selective epitaxial growth process may also include a boron source gas. The boron source gas may include $B_2H_6$, etc. The flow of the $B_2H_6$ may be in a range of approximately 1 sccm~1000 sccm.

In one embodiment, the anti-corrosion ability of the offset spacers 103 may be improved by doping with carbon ions, thus the etching processes may barely affect the offset spacers 103; and the side surfaces of the second gate structure 120 may not be exposed. When the first stress layers 108 are formed by the selective epitaxial growth process, according to the characteristics of the selective epitaxial growth process, the material of the first stress layers 108 may not be formed on the side surfaces of the gate structure 120, thus the defective layers may not be formed on the side surfaces of the second gate structure 120. Therefore, the reliability of the semiconductor device may be improved; and the electrical properties of the semiconductor device may be optimized.

After forming the first stress layers 108, a plurality of subsequent processes may be performed. The subsequently processes may include forming second trenches in the semiconductor substrate 100 at both sides of the first gate structure 110. A process for forming the second trenches may refer to the process for forming the first trenches 107.

The subsequent processes may also include forming a second stress layer in each of the second trenches. The process for forming the second stress layers may refer to the process for forming the first stress layers 108. The second stress layers may be made of SiC or SiCP, etc.

Further, the subsequent processes may include forming first doping regions by doing the first stress layers; and forming second doping regions by doping the second stress layers. The doping regions may be configured as source/drain regions of the semiconductor device. The first layers and the second layers may be doped with any appropriate ions. Various processes may be used to dope the first layers and the second layers to form the first doping regions and the second doping regions, such as an ion implantation process, or a thermal diffusion process, etc.

Further, the subsequent processes may also include forming a first metal silicide layer on the first stress layer 108 and a second metal silicide layer on the second stress layer. The metal silicide layers may include nickel silicide, cobalt silicide, or tungsten silicide, etc. The metal silicide layers may reduce the contact resistance of between the source/drain regions (the doping regions) and interconnection structures, etc.

Because the offset spacers 103 on the side surfaces of the first gate structure 110 may also be doped with carbon ions, the anti-corrosion ability of the offset spacers 103 on both sides of the first gate structure 110 may also be improved. After the etching processes for forming trenches, etc., the side surfaces of the first gate structure 110 may still be covered by the offset spacers 103. Therefore, when the second stress layers are formed in the semiconductor substrate 100 at both sides of the first gate structure 110 by a selective epitaxial growth process, according to the characteristics of the selective epitaxial growth process, the defective layers may not be formed on the side surfaces of the first gate structure 110; and the electrical properties of the semiconductor device may be improved.

FIGS. 12~17 illustrate semiconductor structures corresponding to certain stages of another exemplary fabrication of a semiconductor device.

Figure 12:
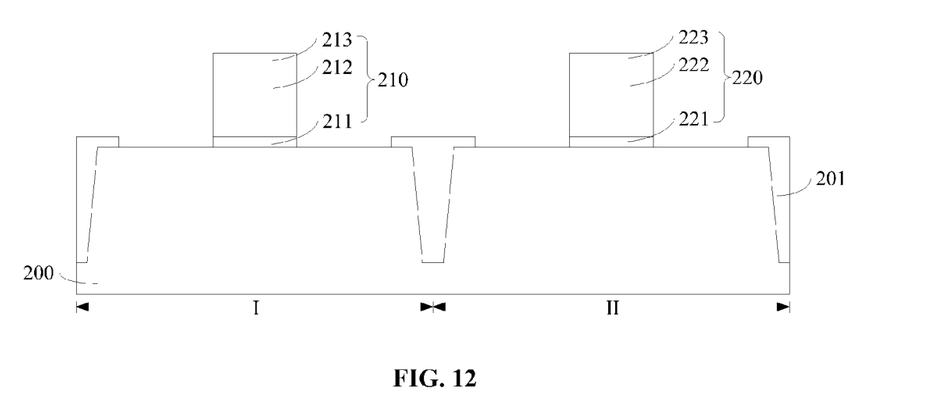
FIGS. 12~17 illustrate semiconductor structures corresponding to certain stages of another exemplary fabrication process of a semiconductor device consistent with the disclosed embodiments.

As shown in FIG. 12, a semiconductor substrate 200 is provided. The semiconductor substrate 200 may have a first region I and a second region II. A first gate structure 210 may be formed on the surface of the semiconductor substrate 200 in the first region I; and a second gate structure 220 may be formed on the surface of the semiconductor substrate 200 in the second region II. Further, isolation structures 201 may be formed in the semiconductor substrate 200. The details of the first gate structure 210, the second gate structure 220 and the isolation structures 201 may refer to the first gate structure 110, the second structure 120 and the isolation structures 101 described in S101.

Figure 13:
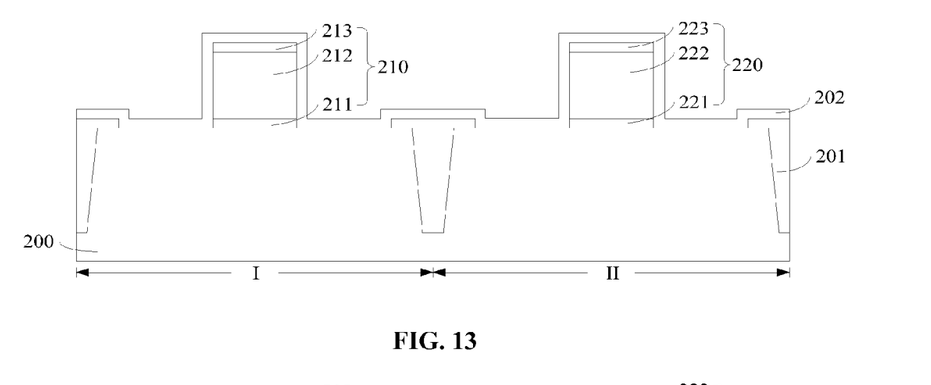

Further, as shown in FIG. 13, an offset spacer material layer 202 covering the first gate structure 210, the second gate structure 220 and the isolation structures 201 may be formed. The details of the offset spacer material layer 202 may refer to the offset spacer material layer 102 described in S102.

Figure 14:
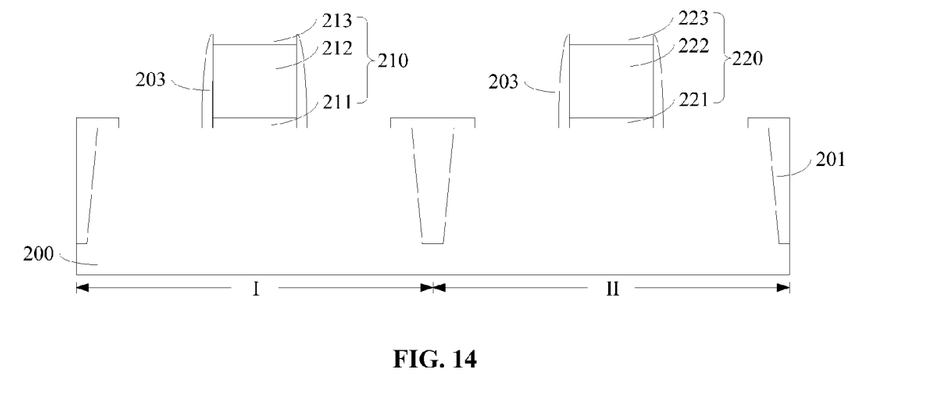

Further, as shown in FIG. 14, after forming the offset spacer material layer 202, offsets spacers 203 may be formed on both sides of the first gate structure 210 and the second gate structure 220. The offset spacers 203 may be formed by an etch back process. The details for forming the offset spacers 203 by the etch back process may refer to S104.

Figure 15:
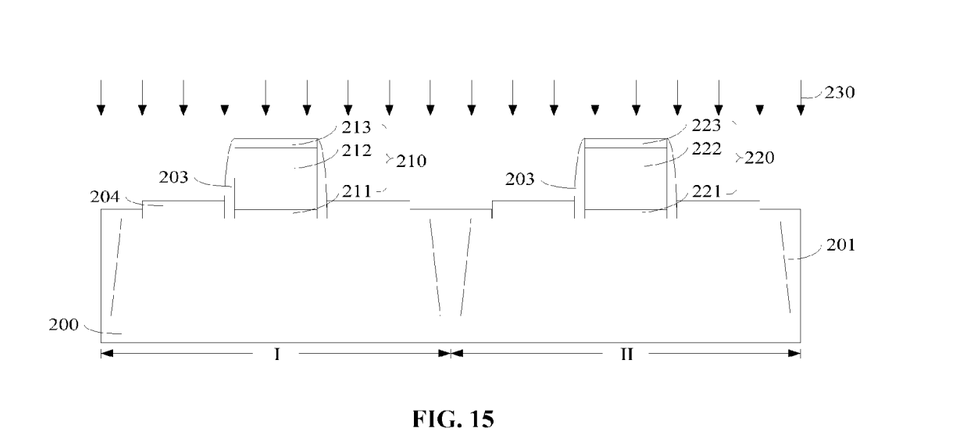

Further, as shown in FIG. 15, after forming the offset spacers 203, the offset spacers 203 may be doped with carbon atoms, i.e., the carbon doping process 230. Specifically, before performing the carbon doping process, the surface of the semiconductor substrate 200 at both sides of the offset spacers 200 may be covered by a photoresist layer 204, so as that the semiconductor substrate 200 may not be doped when the offset spacers 203 are doped with carbon ions. In certain other embodiments, the photoresist layer 204 may also be formed on the top surface of the first gate structure 210 and the second gate structure 220.

Various processes may be used to perform the carbon doping process 230, such as an ion implantation process, or a plasma doping process, etc. In one embodiment, the offset spacers 203 may be doped by the carbon doping process 230 using an ion implantation process.

In one embodiment, the energy of the ion implantation process may be in a range of approximately 6 keV~10 keV. The dose of the ion implantation process may be in a range of approximately 1E16 atom/cm$^2$~5E17 atom/cm$^2$. If the energy is substantially low, the depth of the carbon ion implantation may not be deep enough to improve the anti-corrosion ability of the offset spacers 203. If the energy of is significantly high, the carbon ions may be doped into other undesired regions; and affect the performance of the semiconductor device. If the dose is substantially low, the concentration of the implanted carbon ions may be not be enough to increase the anti-corrosion ability of the offset spacers 203. If the dose is significantly high, the production cost may be increased; and the production efficiency may be lowered.

In certain other embodiments, other appropriate ions may also be used to dope the offset spacers 203 to increase the anti-corrosion ability.

After the carbon doping process 230, a thermal annealing process may be performed onto the offset spacers 203. The thermal annealing process may activate the carbon atoms; and Si—C bonds may be formed in the offset spacers 203. The bond energy of the Si—C bonds may be greater than the bond energy of the Si—N bond, thus the thermal stability and the chemical stability of the Si—C bonds may be better than the thermal stability and the chemical stability of the Si—N bonds. Therefore, the anti-corrosion ability of the offset spacers 203 may be further improved.

Various processes may be used as the thermal annealing process, such as a peak-temperature thermal annealing process, or a millisecond thermal annealing process, etc. In one embodiment, the thermal annealing process is a peak-temperature thermal annealing process. The temperature of the thermal annealing process may be in a range of approximately 800° C.~1000° C. The protection gas of the thermal annealing process may include $N_2$ or He, etc. In certain other embodiments, the thermal annealing process is a millisecond thermal annealing process, the temperature of the millisecond thermal annealing process may be in a range of approximately 1100° C.~1300° C. The thermal annealing time may be in a range of approximately 0.25 millisecond~20 milliseconds.

Figure 16:
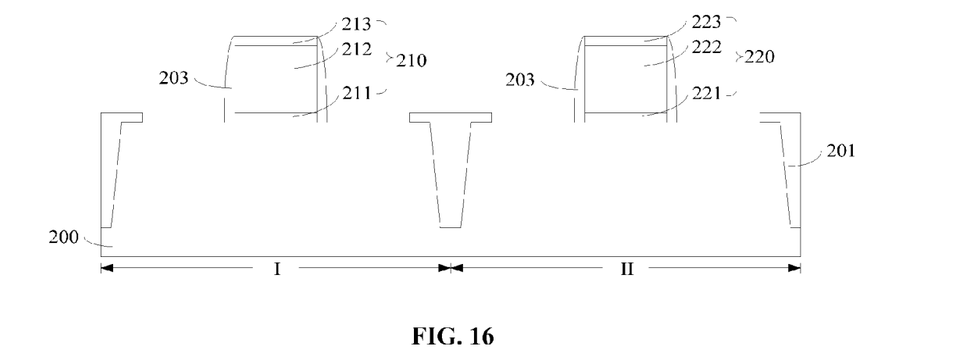

Further, as shown in FIG. 16, after performing the carbon doping process 230, the photoresist layer 204 may be removed. Various processes may be used to remove the photoresist layer 204, such as a plasma ashing process, a wet etching process, or a dry etching process, etc.

In one embodiment, a plasma ashing process is used to remove the photoresist layer 204. The reaction gas of the plasma ashing process may include $O_2$, etc. The flow of $O_2$ may be in a range of approximately 100 sccm~500 sccm. The temperature of the reaction chamber may be in a range of approximately 450° C.~600° C.

In certain other embodiments, a wet etching process may be used to remove the photoresist layer 204. Because the offset spacers 203 may be doped with carbon atoms, the anti-corrosion ability of the offset spacers 203 may be improved. Thus, when the wet etching process is used to remove the photoresist layer 204, the wet etching process may barely damage the offset spacers 203.

Figure 17:
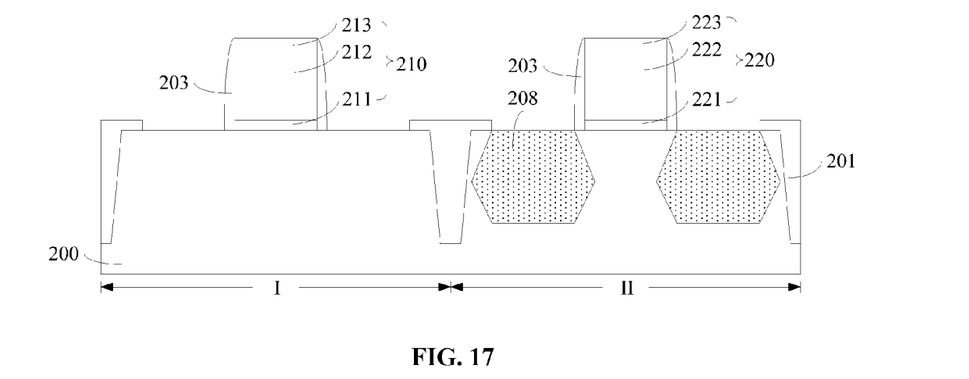

Further, as shown in FIG. 17, after removing the photoresist layer 204, first stress layers 208 may be formed in the semiconductor substrate 200 at both sides of the second gate structure 220. A process for forming the first stress layers 208 may include forming trenches (not labeled) in the semiconductor substrate 200 at both sides of the second gate structure 220 by etching the semiconductor substrate 200; and filling the trenches with first stress layers 208. The details for forming the first stress layers 208 may refer to S105~S110.

After performing the carbon doping process 230, the anti-corrosion ability of the offset spacers 203 may be improved; and the side surfaces of the second gate structure 220 may be covered by the offset spacers 203 after a plurality of etching processes. Thus, the second gate electrode layer 222 may not be exposed in the reaction chamber for forming the first stress layers 208; and the defective layers may not be formed on the side surfaces of the second gate structure 220. Therefore, the stability of the semiconductor device may be improved; and the electrical properties of the semiconductor device may be optimized.

Further, after forming the first stress layers 208, second stress layers (not shown) may be formed in the semiconductor substrate 200 at both sides of the first gate structure 210. Because the offset spacers 203 on the side surfaces of the first gate structure 210 may be doped with carbon ions, the anti-corrosion ability of the offset spacers 203 may be improved. Thus, after a plurality of processes for forming the second stress layers in the semiconductor substrate 200, the defective layers may not be formed on the side surfaces of the first gate structure 210. Therefore, the stability of the semiconductor device may be improved; and the electrical properties of the semiconductor device may be optimized.

Further, after forming the first stress layers, the first stress layers and the second stress layers may be doped with appropriate ions to form doping regions (not shown); and the doping regions may be configured as source/drain regions of the semiconductor device.

Further, metal silicide layers may be formed on the top surface of the doping regions. The metal silicide layers may be used to reduce the contact resistance between the source/drain regions and other interconnection structures, etc.

Thus, a semiconductor device may be formed by the above disclosed processes and methods; and a corresponding semiconductor device is illustrated in FIG. 11. The semiconductor device includes a semiconductor substrate 100 having a first region I and a second region II; and a first gate structure 110 formed on the semiconductor substrate 100 in the first region I and a second gate structure 120 formed on the semiconductor substrate 100 in the second region II. The first gate structure 110 includes a first gate oxide layer 111 formed on the surface of the semiconductor substrate 100 in the first region I, a first gate electrode layer 112 formed on the first gate oxide layer 111 and a first top mask layer 113 formed on the first gate electrode layer 112. The second gate structure 120 includes a second gate oxide layer 121 formed on the surface of the semiconductor substrate 100 in the second region II, a second gate electrode layer 122 formed on the second gate oxide layer 121 and a second top mask layer 123 formed on the second gate electrode layer 122. The semiconductor device also includes offset spacers 103 doped with carbon ions to increase the anti-corrosion ability of the offset spacers 103 formed on both sides of the first gate structure 110 and the second gate structure 120; and a plurality of isolation structures 101 formed in the semiconductor substrate 100 between the first region I and the second region II. Further, the semiconductor device includes first stress layers 108 formed in the semiconductor substrate at both sides of the second gate structure 120; and second stress layers (not shown) formed in the semiconductor substrate 100 at both sides of the first gate structure 110. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:

providing a semiconductor substrate;

forming a first gate structure and a second gate structure on the semiconductor substrate;

forming an offset spacer material layer on the first gate structure, the second gate structure, and the semiconductor substrate;

performing a stability doping process onto the offset spacer material layer;

performing an etch back process onto the offset spacer material layer to form offset spacers on both sides of each of the first gate structure and the second gate structure, wherein: the offset spacers are doped with a certain type of ions to increase an anti-corrosion ability of the offset spacers by a stability doping process;

forming a mask layer on the second gate structure, the offset spacers of the second gate structure, and surface portions of the semiconductor substrate adjacent to the second gate structure;
forming first trenches in the semiconductor substrate on both sides of the first gate structure;
forming first stress layers in the first trenches;
forming second trenches in the semiconductor substrate on both sides of the second gate structure having the mask layer thereon; and
forming second stress layers in the second trenches.

2. The method according claim 1, wherein after forming the first stress layers, further including:
forming doping regions configured as source/drain regions of the semiconductor device in the first stress layers and the second stress layers; and
forming metal silicide layers on the first stress layers and the second stress layers.

3. The method according to claim 1, wherein forming the offset spacers doped with a certain type of ions further includes:
forming an offset spacer material layer to cover the first gate structure and the semiconductor substrate;
performing an etch back process to form the offset spacers;
forming a photoresist layer on the surface of the semiconductor substrate at both sides of the first gate structure; and
performing a stability doping process onto the sidewall spacers.

4. The method according to claim 1, wherein:
the offset spacers are made of SiN; and
the offset spacers are doped with carbon ions.

5. The method according to claim 1, wherein:
the offset spacer material layer is formed by a low pressure chemical vapor deposition process, a thermal atomic layer deposition process, or a plasma atomic layer deposition process.

6. The method according to claim 1, wherein:
the stability doping process is an in situ doping process, or an non-in situ doping process.

7. The method according to claim 1, wherein:
the offset spacer material layer is a single layer structure, or a multiple-stacked structure.

8. The method according to claim 4, wherein:
a doping concentration of carbon atoms is in a range of approximately 0.5%~10%.

9. The method according to claim 4, wherein:
the carbon atoms are uniformly doped into the offset spacers; or
the carbon are doped into the offset spacers with a concentration varying from inside to outside.

10. The method according to claim 9, wherein:
the carbon ions are doped by an ion implantation process, or a plasma doping process.

11. The method according to claim 10, after doping the offset spacers with carbon ions, further including:
performing a thermal annealing process.

12. The method according to claim 2, wherein:
the first stress layers and the second stress layers are formed by a selective epitaxial growth process.

13. The method according to claim 10, wherein:
the carbon ions are doped by an ion implantation process;
an energy of the ion implantation process is in a range of approximately 6 keV~10 keV; and
a dose of the ion implantation process is in a range of approximately 1E16 atom/cm$^2$~5E17 atom/cm$^2$.

14. The method according to claim 12, wherein:
a reaction gas of the selective epitaxial growth process includes a silicon source gas, a germanium source gas, HCl and $H_2$;
the silicon source gas is $SiH_4$ or $SiH_2Cl_2$;
the germanium source gas is $GeH_4$;
a flow of the silicon source gas is in a range of approximately 1 sccm-1000 sccm;
a flow of the germanium source gas is in a range of approximately 1 sccm-1000 sccm;
a flow of HCl is in a range of approximately 1 sccm-1000 sccm;
a flow of H.sub.2 is in a range of approximately 100 sccm-50000 sccm;
a pressure of a reaction chamber is in a range of approximately 1 Torr-500 Torr; and
a temperature of the reaction chamber is in a range of approximately 400° C.-900° C.

* * * * *